(12) United States Patent
Wang

(10) Patent No.: US 10,319,804 B2
(45) Date of Patent: Jun. 11, 2019

(54) ACTIVE MATRIX ORGANIC LIGHT-EMITTING-DIODE DISPLAY BACKBOARD AND MANUFACTURING METHOD THEREOF, DISPLAY DEVICE

(71) Applicant: BOE TECHNOLOGY GROUP CO., LTD., Beijing (CN)

(72) Inventor: Ying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/396,963

(22) Filed: Jan. 3, 2017

(65) Prior Publication Data

US 2017/0117351 A1 Apr. 27, 2017

Related U.S. Application Data

(63) Continuation of application No. 14/436,237, filed as application No. PCT/CN2014/081546 on Jul. 3, 2014, now Pat. No. 9,570,530.

(30) Foreign Application Priority Data

Oct. 28, 2013 (CN) .......................... 2013 1 0515730

(51) Int. Cl.
    *H01L 21/00* (2006.01)
    *H01L 27/32* (2006.01)

(52) U.S. Cl.
    CPC ...... *H01L 27/3279* (2013.01); *H01L 27/3211* (2013.01); *H01L 27/3265* (2013.01); *H01L 27/3276* (2013.01); *H01L 2227/323* (2013.01)

(58) Field of Classification Search
    CPC .... H01G 11/26; H01L 28/90; H01L 31/02008
    See application file for complete search history.

(56) References Cited

U.S. PATENT DOCUMENTS

| 7,545,347 B2 | 6/2009 | Kanda |
| 7,944,141 B2 | 5/2011 | Sagawa et al. |
| 9,082,342 B2 * | 7/2015 | Qi ............................ G09G 3/32 |

(Continued)

FOREIGN PATENT DOCUMENTS

| CN | 1604698 A | 4/2005 |
| CN | 1645445 A | 7/2005 |

(Continued)

OTHER PUBLICATIONS

International Search Report of the International Searching Authority with Notice of Transmittal of the International Search Report of PCT/CN2014/081546 in Chinese, dated Nov. 26, 2014.

(Continued)

*Primary Examiner* — Laura M Menz
(74) *Attorney, Agent, or Firm* — Collard & Roe, P.C.

(57) ABSTRACT

An AMOLED display backboard, a display device and a manufacturing method of an AMOLED display backboard are provided. In the AMOLED display backboard, the number of VDD lines (601) is less than that of sub-pixels in one row, thus reducing area occupied by the VDD lines (601), lessening occupation of VDD lines (601) on the area of circuit board, while realizing connection of circuit input terminals (603) of respective sub-pixels and VDD lines (601) by the VDD connecting line (602).

17 Claims, 7 Drawing Sheets

(56) References Cited

U.S. PATENT DOCUMENTS

| | | | |
|---|---|---|---|
| 9,443,920 B2* | 9/2016 | Noh | H01L 27/3272 |
| 9,570,530 B2* | 2/2017 | Wang | H01L 27/3265 |
| 9,666,132 B2* | 5/2017 | Wu | G09G 3/3258 |
| 9,773,451 B2* | 9/2017 | Wu | G09G 3/3258 |
| 9,875,999 B2* | 1/2018 | Shen | H01L 21/77 |
| 2005/0116615 A1 | 6/2005 | Matsumoto et al. | |
| 2011/0128268 A1 | 6/2011 | Kim et al. | |
| 2012/0026144 A1 | 2/2012 | Kang et al. | |
| 2012/0327064 A1* | 12/2012 | Qi | G09G 3/32 345/212 |
| 2013/0314308 A1 | 11/2013 | Hsu et al. | |
| 2014/0103313 A1 | 4/2014 | Ma et al. | |
| 2015/0357394 A1* | 12/2015 | Wang | H01L 27/3265 257/40 |
| 2016/0155385 A1* | 6/2016 | Yang | G09G 3/3233 345/174 |
| 2016/0284274 A1* | 9/2016 | Tan | G09G 3/3258 |
| 2016/0365032 A1* | 12/2016 | Wu | G09G 3/3258 |
| 2017/0117351 A1* | 4/2017 | Wang | H01L 27/3265 |
| 2017/0169767 A1* | 6/2017 | Song | G09G 3/3241 |

FOREIGN PATENT DOCUMENTS

| | | |
|---|---|---|
| CN | 1945848 A | 4/2007 |
| CN | 101308429 A | 11/2008 |
| CN | 101436610 A | 5/2009 |
| CN | 102081903 A | 6/2011 |
| CN | 102208434 A | 10/2011 |
| CN | 102779834 A | 11/2012 |
| CN | 102916036 A | 2/2013 |
| CN | 102916037 A | 2/2013 |
| CN | 202855739 U | 4/2013 |
| CN | 103531106 A | 1/2014 |
| JP | 4347366 B2 | 10/2009 |
| JP | 4831415 B2 | 12/2011 |

OTHER PUBLICATIONS

Written Opinion of the International Searching Authority with Notice of Transmittal of the International Search Report and Written Opinion for PCT/CN2014/081546 in Chinese, dated Nov. 26, 2014.
First Chinese Office Action of Chinese Application No. 201310515730. 0, dated Jan. 21, 2015 with English translation.
Notification to Grant the Patent Right (Notice of Allowance) for CN 201310515730.0 in Chinese, dated Apr. 30, 2015 with English translation.
The Issued Patent for CN 103531106 B (Application No. CN 201310515730.0) which was granted on Jun. 3, 2015 in Chinese with the Chinese granted claims with an English translation.
International Search Report of the International Searching Authority with Notice of Transmittal of the International Search Report of PCT/CN2014/081546 in Chinese, dated Nov. 26, 2014 with the English translation.
Written Opinion of the International Searching Authority with Notice of Transmittal of the International Search Report and Written Opinion for PCT/CN2014/081546 in Chinese, dated Nov. 26, 2014 with the English translation.

* cited by examiner

ACTIVE MATRIX ORGANIC LIGHT-EMITTING-DIODE DISPLAY BACKBOARD AND MANUFACTURING METHOD THEREOF, DISPLAY DEVICE

CROSS REFERENCE TO RELATED APPLICATIONS

This application is a continuation of U.S. application Ser. No. 14/436,237 filed on Apr. 16, 2015 and Applicant claims priority under 35 U.S.C. § 120 of U.S. application Ser. No. 14/436,237, which application is a national stage application under 35 U.S.C. § 371 of PCT Application No. PCT/CN2014/081546 filed Jul. 3, 2014 which claims priority under 35 U.S.C. § 119 from Chinese Patent Application No. 201310515730.0 filed Oct. 28, 2013, the disclosures of each of which are hereby incorporated by reference. A certified copy of priority Chinese Patent Application No. 201310515730.0 is contained in parent U.S. application Ser. No. 14/436,237. The International Application under PCT article 21(2) was not published in English.

TECHNICAL FIELD

Embodiments of the present disclosure relate to an AMOLED (Active matrix organic light-emitting-diode) display backboard, a manufacturing method thereof, and a display device.

BACKGROUND

Typically, gridded wiring is used for power source signal lines of an active matrix display, for example, VDD (power source voltage), that is, each of sub-pixel units is connected with the VDD, as shown in FIG. 1. Such backboard power source signal wiring is applicable to the backboard circuit design of flat panel displays with use of an active matrix drive method, such as, active matrix liquid crystal displays and active matrix organic light-emitting-diode displays. A pixel unit 1 is surrounded and formed by a data line 101 and a gate line 102, and each pixel unit has a power source signal line VDD connected therewith.

FIGS. 2-3 are schematic views of a sub-pixel layout of an AMOLED backboard. A circuit in FIG. 2 is located on a backboard glass (not shown). See FIG. 3, a part of the circuit below line 2-2' also includes an encapsulation region enclosed by an encapsulation glass 5, that is, the part of the circuit below line 2-2' is located between a backboard glass 10 and the encapsulation glass 5. As shown in FIG. 2, each sub-pixel R, G, B is connected with a power source signal line VDD by metal wiring, meanwhile each sub-pixel R, G, B is connected to a gate scanning line 102 and a display data line 101R, 101G 101B, thus forming the gridded wiring.

FIG. 3 is a schematic view of layout of an AMOLED backboard circuit. For small and medium sized AMOLED displays, direct current (DC) power source signal VDD is provided directly from periphery modular circuits with use of FPC connector 20, and in an effective display region of the backboard circuit, a connection way as shown in FIG. 3 is used, and a test unit 50 is included. FIG. 4 is a schematic view of layout design of a pixel circuit of current AMOLED backboard, and FIGS. 5 and 5b are a circuit diagram and a schematic layout of a 2T1C sub-pixel structure (2 triodes and 1 capacitor). Two-TFT structure is a common structure, which includes a gate electrode and a source electrode, drain electrode (not shown), and a DTFT (drive thin film transistor) is a drive TFT supplying power to a pixel electrode. As shown in FIG. 5a-5b, an AMOLED backboard gate scanning line 102, a display data line 101 and a power source signal VDD line form an orthogonal web structure, wherein wirings in the horizontal direction and vertical direction are generally of different metal layers.

SUMMARY

Embodiments of the present disclosure provide an AMOLED display backboard, a manufacturing method thereof, and a display device to reduce area occupied by VDD lines and lessen occupation of VDD lines on area of circuit board.

An AMOLED display backboard provided by at least one embodiment according to the present disclosure comprising: a pixel unit array comprising gate lines and data lines, wherein each pixel unit comprises N sub-pixels; power source signal line (VDD) lines in a number less than that of n×N sub-pixels in one row, and at least one connecting line of the VDD lines intersected or non-coplanarly intersected with the VDD lines, wherein the VDD connecting line is configured to connect circuit input terminals of respective sub-pixels and VDD lines.

In an example, VDD lines included in each pixel unit are in a number less than or equal to N−1.

In an example, the number of VDD lines included in each pixel unit is less than 3.

In an example, each pixel unit comprises one VDD line.

In an example, the VDD lines have a width larger than that of the data lines.

In an example, the width of the VDD lines is N times greater than that of the data lines.

In an example, the width of the VDD lines is 3 times greater than that of the data lines.

In an example, the VDD connecting line and VDD lines are located in different layers, and the VDD connecting line connects circuit input terminals of respective sub-pixels and VDD lines through via holes.

In an example, the VDD connecting line is provided in a gate layer.

In an example, the VDD connecting line and a polysilicon layer form a sub-pixel capacitor.

In an example, the VDD connecting line is perpendicular to the VDD lines.

At least one embodiment of the present disclosure also provides a display device, comprising an AMOLED display backboard according to embodiments of the present disclosure.

At least one embodiment of the present disclosure also provides a manufacturing method of an AMOLED display backboard comprising: forming a gate electrode and a VDD connecting line in a gate layer; and connecting the VDD connecting line with VDD lines and circuit input terminals of respective sub-pixels through via holes, respectively.

According to at least one embodiment of the present disclosure, a manufacturing method of an active matrix organic light-emitting-diode (AMOLED) display backboard is provided, which comprises: forming a gate layer on a substrate, forming a gate layer pattern comprising the gate electrode and at least one connecting line of the power source signals (VDD) by a pattern process; forming an active layer on the gate layer; and forming a source-drain electrode layer on the active layer, forming data lines, power signal (VDD) lines, connecting lines of sub-pixel electrodes, and via holes; wherein the VDD connecting line is connected with respective VDD lines, connecting lines of the sub-pixel electrodes through the via holes, respectively.

In an example, pixel units are defined by gate lines and the data lines, each pixel unit comprising N sub-pixels, and the VDD lines are in a number less than that of n×N sub-pixels in one row of the sub-pixel units.

In an example, the number of VDD lines formed in each pixel unit is less than or equal to N−1.

In an example, the number of VDD lines included in each pixel unit is less than 3.

In an example, each pixel unit comprises one VDD line.

In an example, the VDD lines have a width greater than that of the data lines.

In an example, the width of the VDD lines is N times greater than that of the data lines.

In an example, the width of the VDD lines is 3 times greater than that of data lines.

In an example, the VDD connecting line is substantially perpendicular to the VDD lines.

In an example, the manufacturing method further comprises forming a poly-silicon layer; wherein the VDD connecting line and the poly-silicon layer form a sub-pixel capacitor.

In an example, the manufacturing method further comprises forming a buffer layer, a gate insulating layer and a planarization layer on the substrate.

BRIEF DESCRIPTION OF THE DRAWINGS

Embodiments of the present disclosure will be described in detail hereinafter in conjunction with accompanying drawings to allow one of ordinary skill in the art to understand the present disclosure more clearly, in which.

DETAILED DESCRIPTION

Technical solutions according to the embodiments of the present disclosure will be described clearly and completely as below in conjunction with the accompanying drawings of embodiments of the present disclosure. It is apparent that the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

With high requirements of display resolution of display devices, a demand of compact layout design becomes a critical restriction factor. Typically, a sub-pixel circuit design with a compensation function is used for the backboard circuit design of an AMOLED display backboard, so that the circuit structure of each sub-pixel is relatively complicated, requiring use of more transistors and capacitors and more wires between columns, which causes the layout design to be more obviously restricted by area.

Embodiments of the present disclosure provide an AMOLED display backboard, a display device and a manufacturing method of an AMOLED display backboard. In the AMOLED display backboard, the number of VDD lines is less than the number of sub-pixels in one row, thus reducing area occupied by VDD lines, lessening occupation of VDD lines on the area of circuit board, meanwhile realizing connection of respective circuit input terminals and VDD lines by the VDD connecting lines connect the respective sub-pixel circuit terminals and VDD lines.

Figure 6:
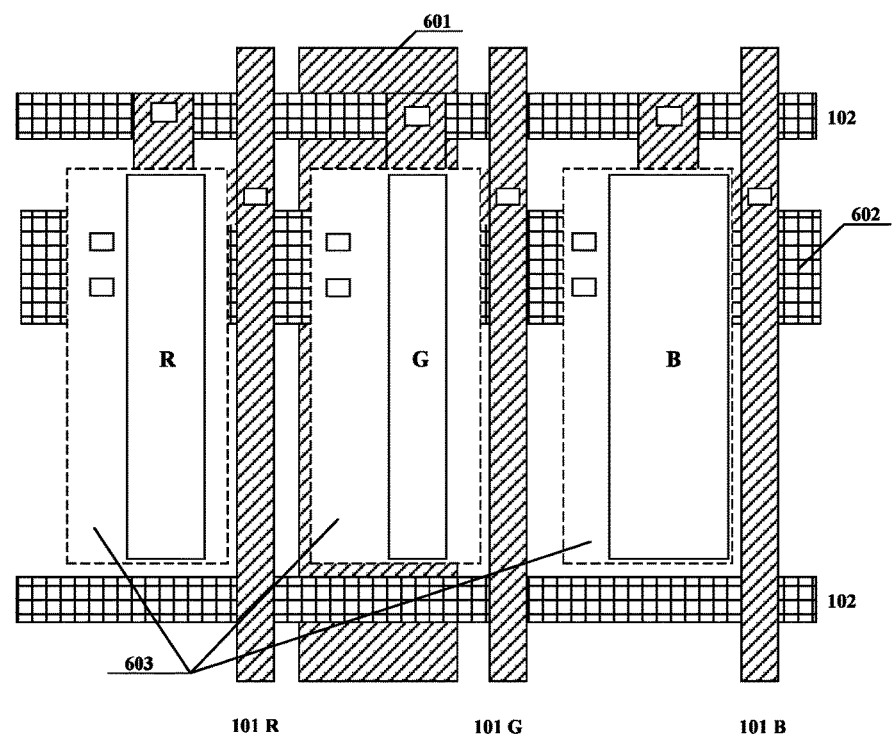
FIG. 6 is a schematic layout of sub-pixels of an AMOLED display backboard according to an embodiment of the present disclosure.

As shown in FIG. 6, embodiments of the present disclosure provide an AMOLED display backboard including: VDD lines 601, the number of which is less than the number of sub-pixels in one row, and at least one VDD connecting line 602 intersected or non-coplanarly intersected with VDD lines 601.

The VDD connecting line 602 is used to connect respective sub-pixel circuit input terminals 603 and VDD lines 601, and each sub-pixel circuit input terminal 603 is electrically connected with a source electrode of DTFT.

In an example, a VDD connecting line 602 is perpendicular to VDD lines 601.

Since the number of VDD lines 601 is less than the number of sub-pixels in one row, circuit input terminals 603 of respective sub-pixels are not directly connected to VDD lines 601, they are connected through at least one VDD connecting line 602 perpendicular to VDD lines 601 in the AMOLED display backboard, so as to connect circuit input terminals 603 of respective sub-pixels and VDD lines 601. In this way, the area occupied by VDD lines is reduced without affecting power supply of sub-pixels, thus reducing occupation of VDD lines on the area of circuit board. Meanwhile, since respective circuit input terminals 603 of sub-pixels connect respective VDD lines, resistance of VDD lines is decreased, thereby reducing transmission loss.

For the pixel unit typically including three sub-pixels, such as, sub-pixel R, sub-pixel G and sub-pixel B, each sub-pixel circuit can be supplied with power by VDD lines or a VDD connecting line 602. Pixel units with other numbers of sub-pixels can also be supplied with power by VDD lines and a VDD connecting line 602.

Figure 1:
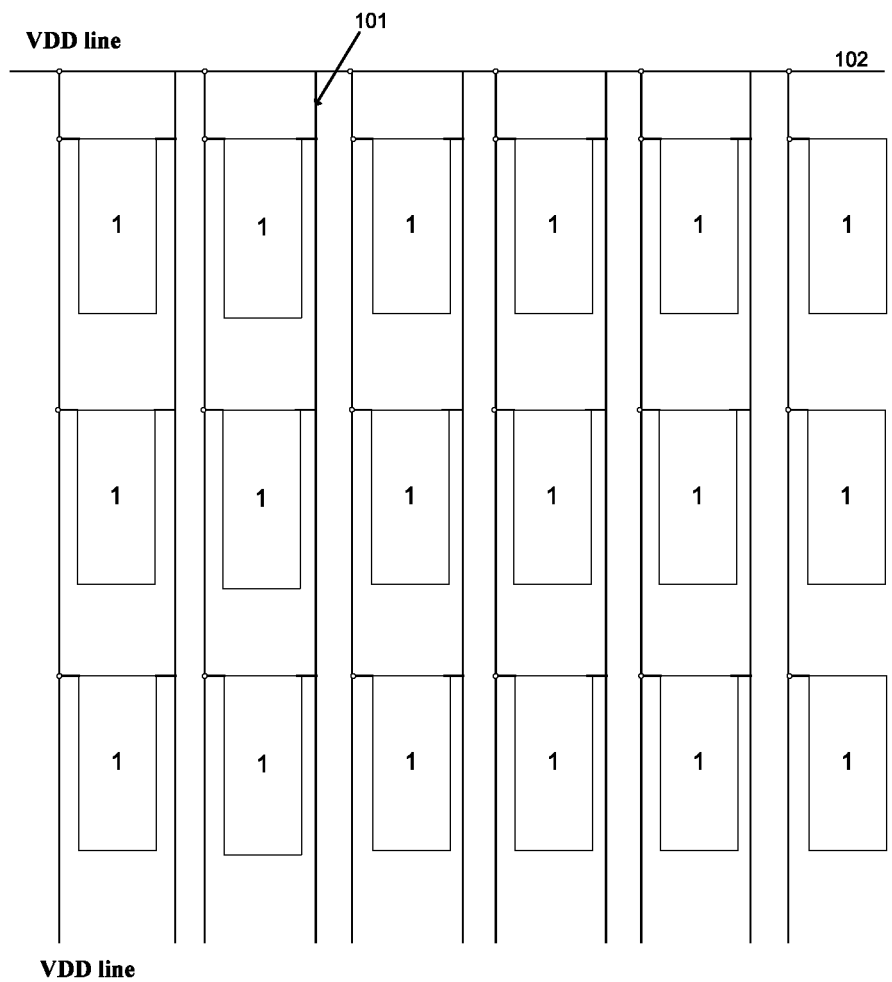
FIG. 1 is a schematic layout of VDD lines of an active matrix display backboard.
Figure 2:
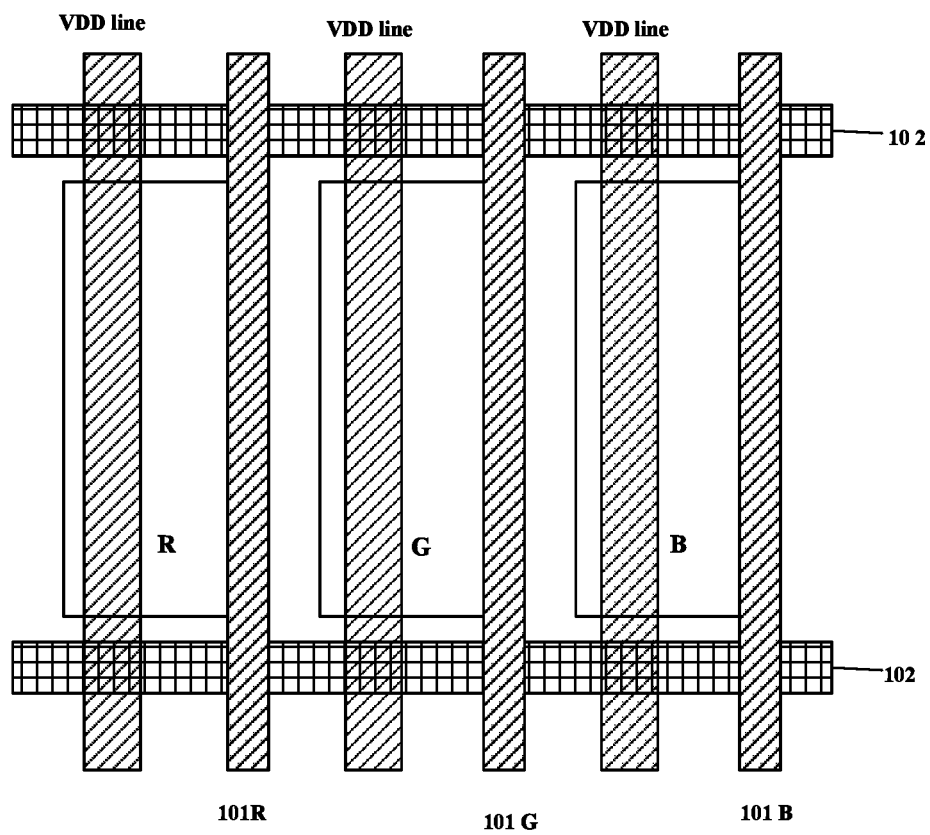
FIG. 2 is a schematic layout of sub-pixels of an active matrix display backboard.
Figure 3:
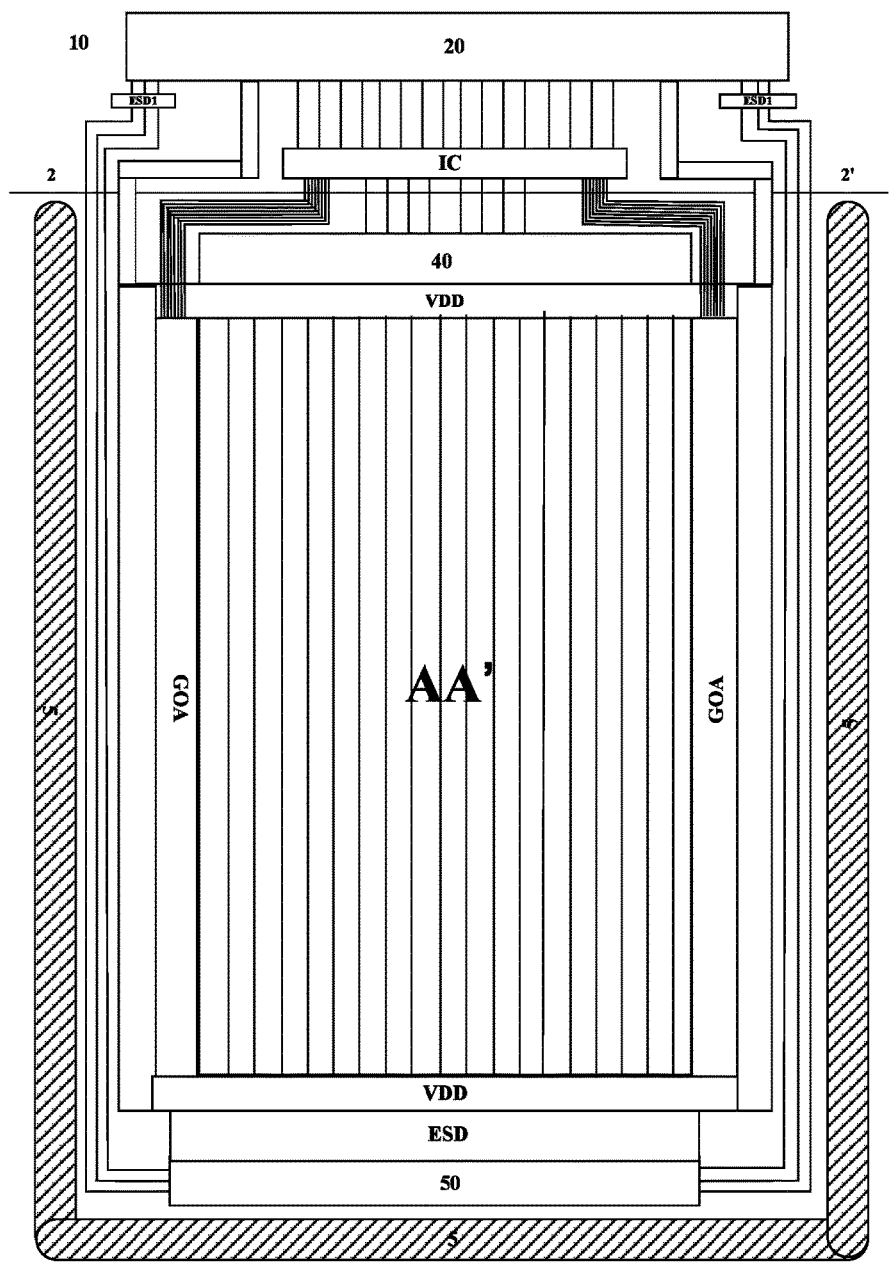
FIG. 3 is a schematic configuration layout of sub-pixels of an AMOLED display backboard.
Figure 4:
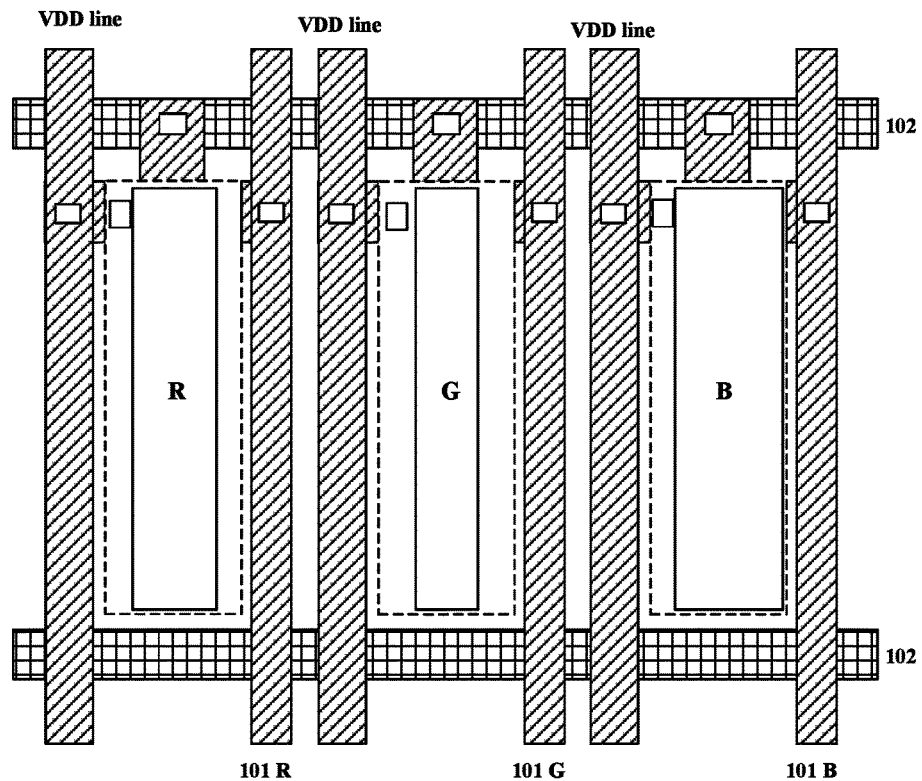
FIG. 4 is a schematic layout of sub-pixels of an AMOLED display backboard.
Figure 7:
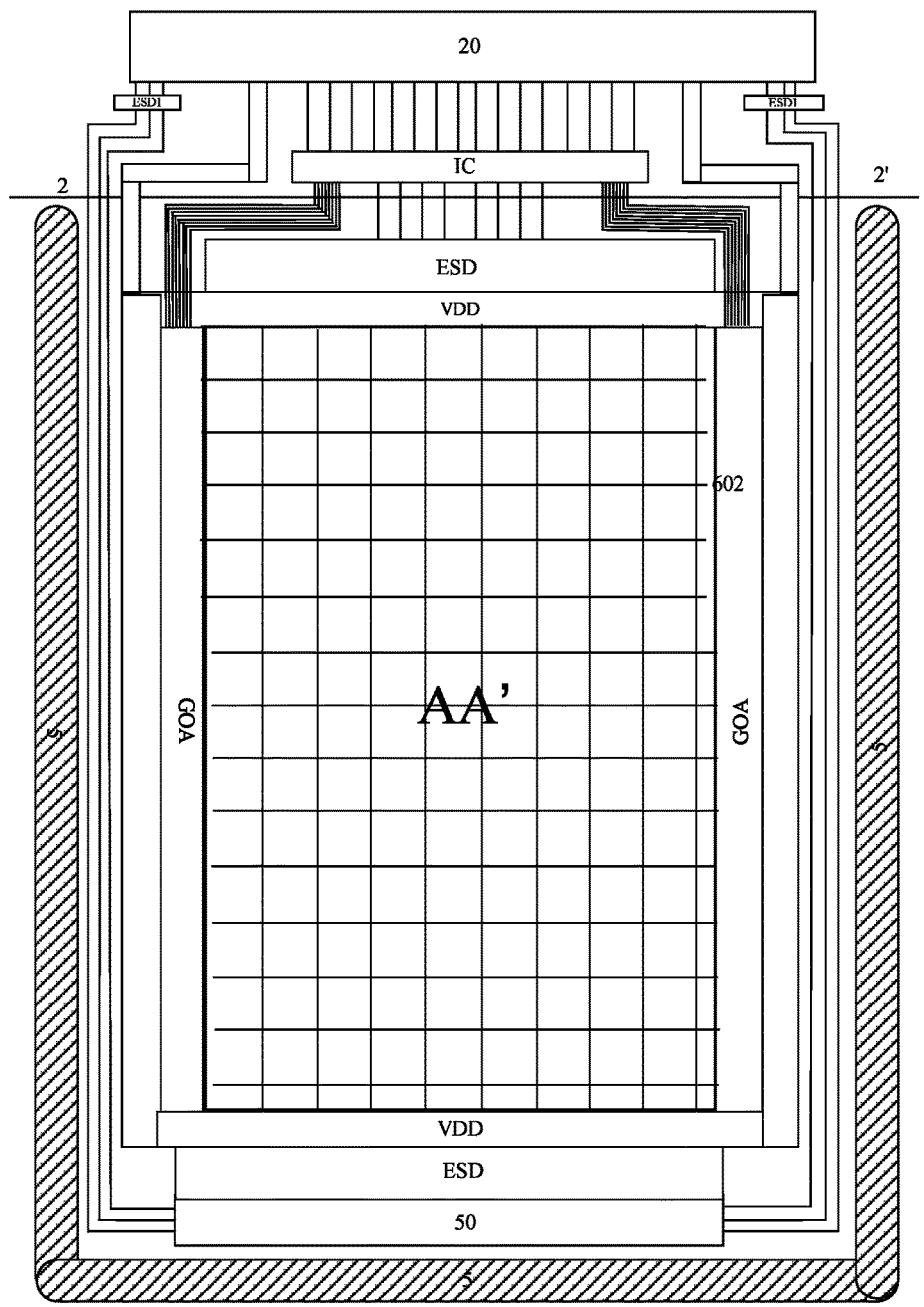
FIG. 7 is a schematic layout of a circuit of an AMOLED display backboard according to an embodiment of the present disclosure.

A schematic layout of a AMOLED display backboard is shown in FIG. 7. In AA' region, in addition to longitudinally arranged VDD connecting lines, there are transversally arranged VDD lines. The number of VDD lines in FIG. 7 is less than that in FIG. 3.

For example, the number of VDD lines included in each pixel unit may be less than the number of sub-pixels therein, such as three, so as to reduce the number of VDD lines as much as possible, and lessen occupation on each sub-pixel due to reduction of the number of VDD lines.

For example, multiple pixel units may share a common VDD line. Also, in certain pixel unit, the number of VDD lines may be 2 (in the case of each pixel unit including three sub-pixels).

For example, in the same case of each pixel unit including three sub-pixels, each pixel unit may include one VDD line, which VDD line supplies power to 3 sub-pixels in this pixel unit, thus facilitating display control to each of the sub-pixels.

Since one VDD line needs to supply power to multiple sub-pixels, the current in the VDD line will increase, therefore, in order to reduce the resistance of the VDD line so as to reduce direct current (DC) consumption. The width of the VDD line may be increased such that the width of the VDD line is larger than that of the data line. The larger the width of the VDD line, the smaller the resistance of the VDD line, and the less the DC consumption. For example, the width of the VDD line is set to be 3 times larger than the width of the data line, while a normal VDD line is as wide as the data line. In the present example, the width of the VDD line is designed to be 3 times larger than that of the data line, thus supplying power to three sub-pixels in one pixel unit at that same time by one VDD line, without changing current supply voltage. For example, the width of the VDD line may be set at 8 μm, this is also for the case that the pixel unit including three sub-pixels. For other cases that the pixel unit includes more than two sub-pixels, similar corresponding design is feasible.

A VDD connecting line and VDD lines are located at different layers for ease of design and manufacture, at the same time to further reduce area occupied by circuit lines, and the VDD connecting line may connect circuit input terminals of respective sub-pixels and VDD lines.

For example, the VDD connecting line may be disposed at the gate layer, in such a way, the gate electrode and the VDD connecting line can be manufactured simultaneously, thereby reducing one mask etching process. In accordance with real situation, the VDD connecting line may also be disposed at other layers and manufactured with other conductive layers, which can also reduce times of masking.

In a backboard having low temperature poly-silicon as an active layer, the VDD connecting line and the poly-silicon layer may form a sub-pixel capacitor, so as to reduce area occupied by the capacitor.

Figure 5A:
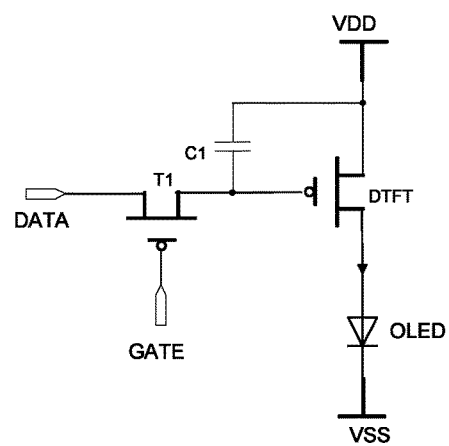
FIG. 5a is a circuit diagram of a 2T1C sub-pixels structure.
Figure 5B:
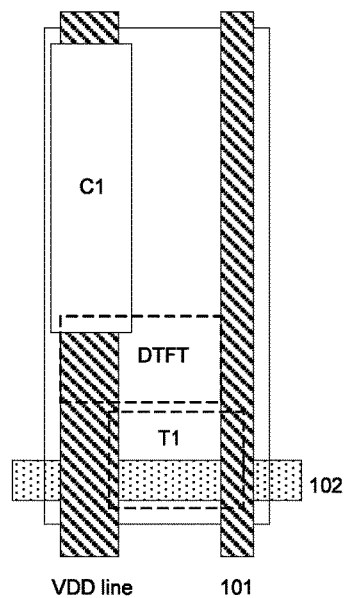
FIG. 5b is a schematic layout of 2T1C sub-pixels.
Figure 8:
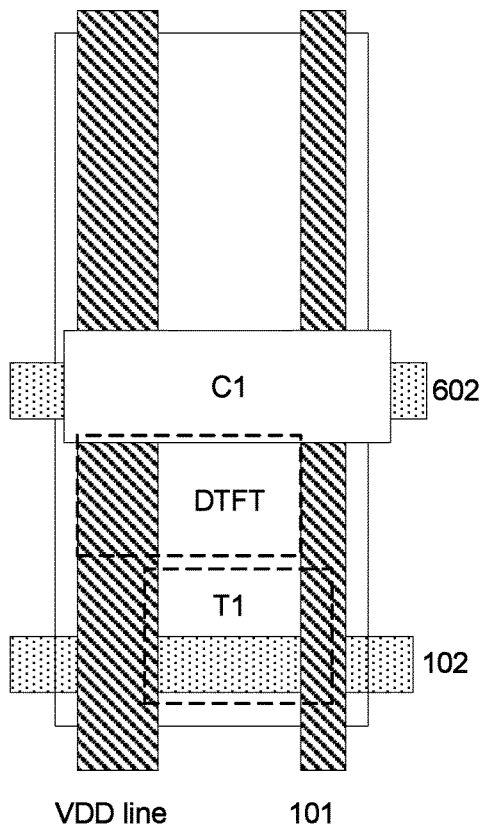
FIG. 8 is a schematic layout of 2T1C sub-pixels according to an embodiment of the present disclosure.

As shown in FIG. 8, a circuit of a 2T1C sub-pixel structure shown in FIG. 5*a* may be realized by such a layout, in which two-TFT structure is a common structure, which includes a gate electrode and a source and drain electrode (not shown). As such, the VDD connecting line 602 and the poly-silicon layer forms a sub-pixel capacitor C1.

When a top emission type of whole structure is used, since a transparent ITO (Indium Tin Oxides) conductive layer utilized by an anode in the OLED device structure is realized, for an OLED (organic light-emitting-diode) device being deposited in layer to layer on the backboard structure by an evaporation process. Such an ITO conductive layer is located on the upper layer of the whole backboard structure, that is, over the other two metal layers, and it is connected with a lower metal layer through a via hole when necessary. In such a construction, VDD lines are in a form of orthogonal network, in other words, there are not only longitudinal VDD lines but also transversal VDD lines, such that layout of transparent ITO electrodes on the upper layer and aperture ratio of sub-pixels will not be affected.

Embodiments of the present disclosure provide a display device including an AMOLED display backboard according to embodiments of the present disclosure.

Figure 9:
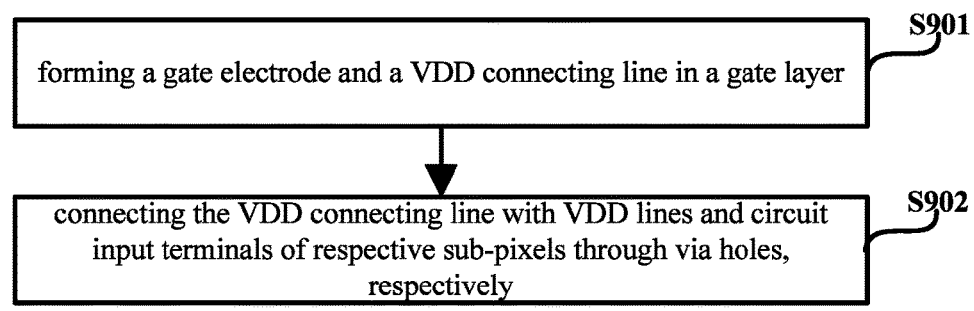
FIG. 9 is a flow chart of a manufacturing method of an AMOLED display backboard according to an embodiment of the present disclosure.

Embodiments of the present disclosure also provide a manufacturing method of an AMOLED display backboard. As shown in FIG. 9, the method includes the following steps: step S901, forming a gate electrode and a VDD connecting line in a gate layer; and step S902, connecting the VDD connecting line with VDD lines and circuit input terminals of respective sub-pixels through via holes.

Manufacture of the gate electrode and the VDD connecting line at the gate layer includes: depositing the gate layer; applying a mask to the gate layer, wherein mask patterns include pattern of the gate electrode and pattern of the VDD connecting line; performing exposure, development and etching process, thus completing manufacture of the gate electrode and the VDD connecting line.

For example, an AMOLED display backboard is manufactured by the following method: deposing a buffer layer firstly on a substrate, then depositing an active layer, and then crystallizing a low temperature poly-silicon layer (LTPS). The crystallization process may include laser crystallization, solid-state crystallization, or the like.

The method further includes performing exposure, development, and etching process of a pattern of an active layer.

The method further includes: depositing a gate insulating (GI) layer and a gate layer; then performing metal exposure, development and etching of the gate layer; ion doping of the source and drain electrode by using the gate layer as a barrier layer of a region of TFT channel ion implantation.

The method further includes depositing an insulating dielectric layer (ILD) of a protection layer of the gate electrode metal layer, and performing exposure, development and etching process of a via hole pattern at the source and drain electrode.

The method further includes depositing a source-drain metal layer, performing exposure, development and etching of the source-drain metal layer, so as to form display data lines, VDD lines, a connecting line of sub-pixel electrodes and other corresponding signal lines.

The method further includes depositing a planarization (PLN) layer. The PLN layer can protect the source-drain (SD) metal layer.

The method further includes performing exposure, development, etching process of via holes configured to connect a transparent pixel electrode ITO and a TFT source drain electrode, then depositing a transparent pixel electrode ITO, and performing exposure, development, and etching process of the transparent pixel electrode ITO, so as to form a pixel electrode pattern.

The method further includes performing deposition, exposure, and developing process of a pixel definition layer (PDL).

A typical way of an OLED device preparation process is performed by using an evaporation process of a fine metal mask (FMM).

With the arrangement method of power source signal lines according to the present disclosure, the layout area of the pixel circuit may be used to a great extent, as a result, it brings a large flexibility to the layout design of the sub-pixel circuit design with a compensating circuit. By using orthogonal power source lines, IR drop (caused by parasitic resistance on the power source line) on the power source line is further reduced, which bring large flexibility of power consumption of a drive circuit of the backboard circuit and design margin of drive voltage.

Embodiments of the present disclosure provide an AMOLED display backboard, a display device and a manufacturing method of an AMOLED display backboard. In the AMOLED display backboard, the number of VDD lines is less than the number of sub-pixels in one row, thus reducing area occupied by the VDD lines, lessening occupation of VDD lines on the area of circuit board, meanwhile realizing connection of respective circuit input terminals and VDD lines by using the VDD connecting line to connect circuit input terminals of respective sub-pixels and VDD lines.

It is understood that the above embodiments and implementations are only for explaining the present disclosure, and the present disclosure is not intended to limited thereto. For one of ordinary skill in the art, various modifications and variations may be made without departing from the spirit and scope of embodiments of the present disclosure, and all of which and their equivalents shall fall within the protection scope of the present invention. The scope protected by the present invention is defined by the claims.

The present application claims priority of Chinese patent application No. 201310515730.0 filed on Oct. 28, 2013 titled "an active matrix organic light-emitting-diode display backboard, a display device", the entire contents of which are incorporated herein by reference.

What is claimed is:

1. An active matrix organic light-emitting-diode (AMOLED) display backboard, comprising:
    a pixel unit array, wherein each pixel unit comprises N sub-pixels and defined by gate lines and data lines;
    power source signal lines (VDD) in a number less than that of sub-pixels n×N in one row, and;
    at least one VDD connecting line intersected or non-coplanarly intersected with the VDD lines;
    wherein the VDD connecting line other than the gate lines is configured to connect circuit input terminals of respective sub-pixels and VDD lines; and
    the VDD connecting line and the gate electrode are formed from a same gate layer which forms part of a subpixel capacitor.

2. The display backboard according to claim 1, wherein the VDD lines have a width N times greater than that of the data lines, where N is a positive integer larger than or equal to 2.

3. The display backboard according to claim 2, wherein the width of each VDD line is about 8 μm.

4. A manufacturing method of an active matrix organic light-emitting-diode (AMOLED) display backboard comprises:
    forming a gate layer on a substrate, forming a gate layer pattern including the gate electrode and a connecting line of the power source signal (VDD) lines by a pattern process;
    forming an active layer on the gate layer; and
    forming a source-drain layer on the active layer, forming gate lines, data lines, the VDD lines, connecting lines of sub-pixel electrodes, and via holes over the source-drain layer;
    wherein the gate lines and data lines are intersected with each other to define pixel units including sub-pixels, the VDD connecting line other than the gate lines is connected with respective VDD lines, and connecting lines of the sub-pixel electrodes through the via holes, respectively.

5. The manufacturing method of an AMOLED display backboard according to claim 4, wherein each pixel unit includes N sub-pixels, and the VDD lines is in a number less than that of n×N sub-pixels in one row of the sub-pixel units.

6. The manufacturing method of an AMOLED display backboard according to claim 4, wherein VDD lines formed in each pixel unit are in a number less than or equal to N−1.

7. The manufacturing method of an AMOLED display backboard according to claim 6, wherein the number of VDD lines included in each pixel units is less than 3.

8. The manufacturing method of an AMOLED display backboard according to claim 6, wherein each pixel unit includes one VDD line.

9. The manufacturing method of an AMOLED display backboard according to claim 4,
    wherein the VDD lines have a width greater than that of the data lines.

10. The manufacturing method of an AMOLED display backboard according to claim 9, wherein the width of the VDD lines is N times greater than that of the data lines.

11. The manufacturing method of an AMOLED display backboard according to claim 9, wherein the width of the VDD lines is 3 times greater than that of data lines.

12. The manufacturing method of an AMOLED display backboard according to claim 4, wherein the VDD connecting line is substantially perpendicular to the VDD lines.

13. The manufacturing method of an AMOLED display backboard according to claim 4, further comprising:
    forming a poly-silicon layer;
    wherein the VDD connecting line and the poly-silicon layer form a sub-pixel capacitor.

14. The manufacturing method of an AMOLED display backboard according to claim 4, further comprising, forming a buffer layer, a gate insulating layer and a planarization layer on the substrate.

15. The manufacturing method according to claim 4, wherein the AMOLED display board comprises:
    a pixel unit array, wherein each pixel unit comprises N sub-pixels and defined by the gate lines and the data lines;
    power source signal lines (VDD) in a number less than that of sub-pixels n×N in one row, and;
    at least one VDD connecting line intersected or non-coplanarly intersected with the VDD lines;
    wherein the VDD connecting line other than the gate lines is configured to connect circuit input terminals of respective sub-pixels and VDD lines; and the VDD connecting line and the gate electrode are formed from a same gate layer which forms part of a subpixel capacitor.

16. The manufacturing method according to claim 15, wherein the VDD lines have a width N times greater than that of the data lines, where N is a positive integer larger than or equal to 2.

17. The manufacturing method according to claim 15, wherein the width of each VDD line is about 8 μm.

* * * * *